United States Patent
Kusumoto et al.

[11] Patent Number: 5,953,597
[45] Date of Patent: Sep. 14, 1999

[54] METHOD FOR PRODUCING INSULATED GATE THIN FILM SEMICONDUCTOR DEVICE

[75] Inventors: Naoto Kusumoto, Kanagawa; Shunpei Yamazaki, Tokyo, both of Japan

[73] Assignee: Semicondutor Energy Laboratory Co., Ltd., Kanagawa-ken, Japan

[21] Appl. No.: 08/604,547

[22] Filed: Feb. 21, 1996

[30] Foreign Application Priority Data

Feb. 21, 1995 [JP] Japan .................................. 7-056481

[51] Int. Cl.⁶ .......................... H01L 21/00; H01L 21/84
[52] U.S. Cl. ........................................ 438/161; 438/164
[58] Field of Search ....................... 437/174, 41; 148/51, 148/DIG. 9; 257/65, 72; 438/FOR 334, 161, 164

[56] References Cited

U.S. PATENT DOCUMENTS

| | | | |
|---|---|---|---|
| 4,409,724 | 10/1983 | Tasch | 437/19 |
| 5,145,808 | 9/1992 | Sameshima | 437/173 |
| 5,313,076 | 5/1994 | Yamazaki | 257/66 |
| 5,504,020 | 4/1996 | Aomori | 437/40 |
| 5,523,257 | 6/1996 | Yamazaki | 438/166 |
| 5,580,801 | 12/1996 | Maegawa | 437/40 |
| 5,608,232 | 3/1997 | Yamazaki | 257/66 |
| 5,712,191 | 1/1998 | Nakajima et al. | 437/174 |

FOREIGN PATENT DOCUMENTS 62-250629  10/1987  Japan .

*Primary Examiner*—John F. Niebling
*Assistant Examiner*—Michael S. Lebentritt
*Attorney, Agent, or Firm*—Fish & Richardson P.C.

[57] ABSTRACT

An amorphous semiconductor film is etched so that a width of a narrowest portion thereof is 100 $\mu$m or less, thereby forming island semiconductor regions. By irradiating an intense light such as a laser into the island semiconductor regions, photo-annealing is performed to crystallize it. Then, of end portions (peripheral portions) of the island semiconductor regions, at least a portion used to form a channel of a thin film transistor (TFT), or a portion that a gate electrode crosses is etched, so that a region that the distortion is accumulated is removed. By using such semiconductor regions, a TFT is produced.

6 Claims, 7 Drawing Sheets

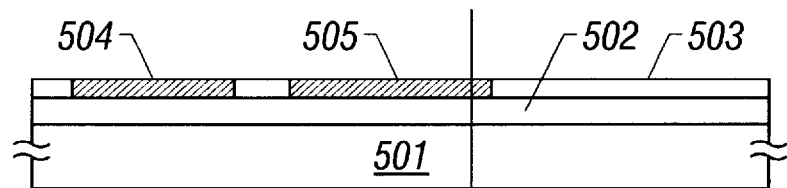
FIG. 5A
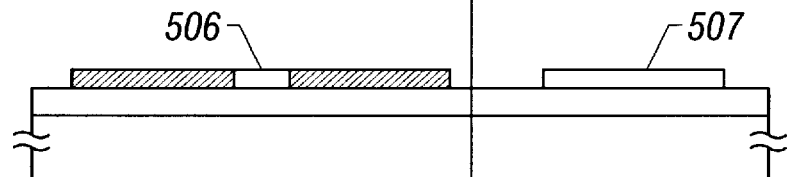
FIG. 5B
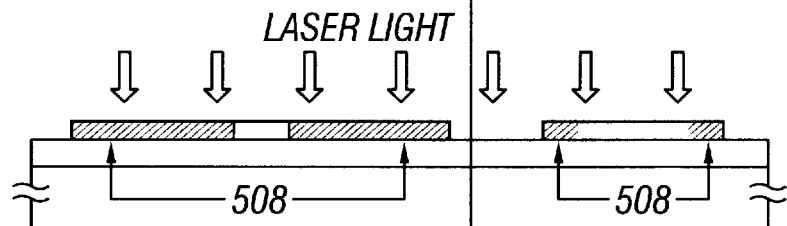
FIG. 5C
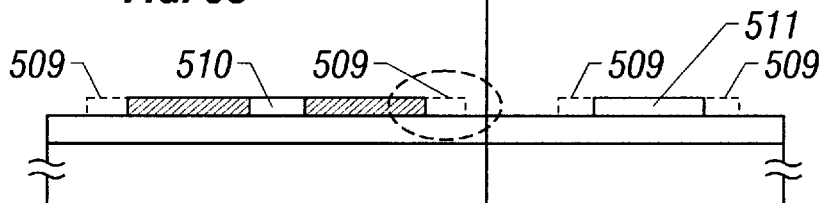
FIG. 5D
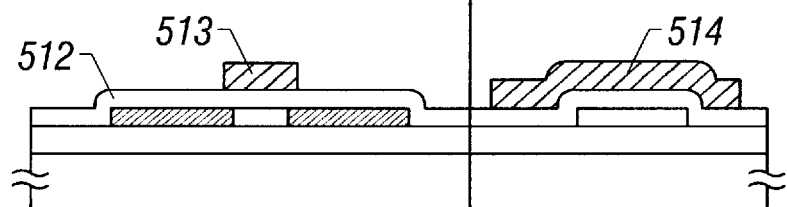
FIG. 5E
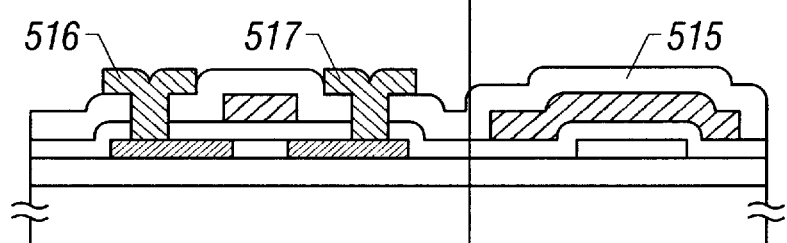
FIG. 5F A LEFT PART ← → A RIGHT PART

METHOD FOR PRODUCING INSULATED GATE THIN FILM SEMICONDUCTOR DEVICE

BACKGROUND OF THE INVENTION

1. Field of the Invention

The present invention disclosed in the specification relates to a method for producing a semiconductor device having a gate electrode using a crystalline thin film semiconductor, for example, a thin film transistor (TFT). As application of the TFT, an active matrix type liquid crystal display device has been known. This display device performs a fine and high resolution display by arranging a TFT as a switching element in each of several hundred thousands or more pixels disposed at a matrix form.

2. Description of the Related Art

Recently, a transistor using a thin film semiconductor formed on a glass or quartz substrate, such as a thin film transistor (TFT) has been suggested. A thin film semiconductor having a thickness of several 100 to several 1000 Å is formed on a surface of a glass substrate or a quartz substrate, and then the transistor (insulated gate field effect transistor) is formed using the thin film semiconductor.

Of such the TFT, a TFT using an amorphous silicon film and a TFT using a crystalline silicon film is used in practice. Since the TFT using the crystalline silicon film has a superior characteristic, it has a great future.

In the TFT using a crystalline silicon semiconductor, the crystalline silicon thin film is obtained by a method for thermally-annealing an amorphous silicon film, or a method for forming a crystalline silicon film directly using a vapor phase growth method. However, in order to perform the process at a low temperature, a photo-annealing for crystallizing an amorphous silicon film by irradiating an intense light such as a laser has been proposed. (for example, Japanese Patent Application Open No. 4-37144)

There are two main methods used to obtain a crystalline silicon film by photo-annealing. In a first method, photo-annealing is performed after etching a semiconductor thin film into a shape of an element to be formed. In a second method, after photo-annealing for an even (flat) film is performed, the film is etched into a shape of an element to be formed. In general, it has known that the element obtained by the first method has a superior characteristic (field effect mobility) than that obtained by the second method. This may be because in the first method, the film is contracted by photo-annealing, and thus a central portion of a pattern is stressed, thereby increasing crystallinity of the film.

However, there is a problem in this case. That is, although an initial characteristic is good, after use for a long period of time, the characteristic is deteriorated largely.

The cause for the deterioration the conventional method will be explained with FIGS. 3A to 3D. Initially, an island semiconductor region 31 of amorphous silicon having a rectangular shape 32 is formed as shown in FIG. 3A. When photo-annealing is performed, the film is contracted slightly by crystallization. A dotted line of the figure represents a size of the island semiconductor region before the photo-annealing. In this contraction process, a region 33 is formed where distortion is accumulated in an outermost portion of the island semiconductor region 31 is formed. The crystallinity of such the region 33 is not as high. (FIG. 3B)

A gate electrode 34 is sometimes formed across such an island region (FIG. 3C) FIG. 3D shows (a–b) cross section along the gate electrode, the region 33 where distortion is accumulated however, is formed under the gate electrode 34 and a gate insulating film 35. This deteriorates an interface characteristic between the region 35 and the gate insulating film. Therefore, when a voltage is applied to the gate electrode 34, charge is trapped, so that deterioration occurs by a parasitic channel or the like due to the charge trapping. (FIG. 3D)

SUMMARY OF THE INVENTION

An object of the present invention is to prevent such a deterioration, and to provide a method for producing an insulated gate semiconductor device having less deterioration.

According to a first aspect of the present invention, the following processes are obtained.

(1) An amorphous semiconductor film is etched into a first shape such that a width of a narrowest portion is 100 μm or less, to form an island semiconductor region.

(2) The semiconductor region is photo-annealed to crystallize it or to increase the crystallinity thereof.

(3) Of end portions (or peripheral portions) of the semiconductor region, at least a gate electrode or a channel forming region of a semiconductor device is etched by 10 μm or more from ends, to form a semiconductor region having a second shape.

Also, according to a second aspect of the present invention, the following processes are obtained.

(1) An amorphous semiconductor film is etched into a first shape that a width of a narrowest portion is 100 μm or less, to form an island semiconductor region.

(2) The semiconductor region is photo-annealed to crystallize it or to increase the crystallinity thereof.

(3) At least a part of end portions (or peripheral portions) of the semiconductor region is etched.

(4) An gate insulating film is formed to cover the semiconductor region.

(5) An gate electrode is formed across the etched portion of the end portions of the semiconductor region.

(6) An N-type or P-type impurity is introduced or diffused using the gate electrode as a mask.

In the first and second aspects of the present invention, the first shape is one of a rectangle, a regular polygon and an ellipse (including a circle), and generally it is preferred that a shape does not include a concave portion at any point on a periphery.

In the above structure, an amorphous silicon film is formed on a substrate having an insulating surface, such as a glass substrate or a quartz substrate by plasma chemical vapor deposition (plasma CVD) and low pressure thermal CVD. In photo-annealing, various excimer lasers such as a KrF excimer laser (wavelength of 248 nm) and a XeCl excimer laser (wavelength of 308 nm), and a Nd:YAG laser (wavelength of 1064 nm) and a second harmonic component (wavelength of 532 nm) and a third harmonic component (wavelength of 355 nm) may be used. In the present invention, a light source may pulse-oscillate or continuous-oscillate. As disclosed in Japanese Patent Application Open No. 6-318701, in photo-annealing, crystallization may be promoted using a metal element (for example, Fe, Co, Ni, Pd or Pt) which promotes crystallization of silicon.

The present invention disclosed in the specification is effective in a case wherein an island semiconductor region is constructed in a single-crystalline region or a region equivalent to the single-crystalline region. As described later, the single-crystalline region or the region equivalent to the single-crystalline region can be obtained by scan-irradiating a linearly processed laser light into an amorphous silicon film and a crystalline silicon film.

The single-crystalline region or the region equivalent to the single-crystalline region is defined as a region that the following conditions are satisfied.

(1) The region does not contain substantially crystal boundary.

(2) The region contains hydrogen or a halogen element to neutralize a point defect at a concentration of $1 \times 10^{15}$ to $1 \times 10^{20}$ atoms cm$^{-3}$.

(3) The region contains carbon or nitrogen at a concentration of $1 \times 10^{16}$ to $5 \times 10^{18}$ atoms cm$^{-3}$.

(4) The region contains oxygen at a concentration of $1 \times 10^{17}$ to $5 \times 10^{19}$ atoms cm$^{-3}$.

The above concentrations are defined as a minimum value of a measurement value measured by secondary ion mass spectrometry (SIMS).

In the present invention disclosed in the specification, only a channel portion is etched so as not to be adjacent to a channel that influences characteristics of a semiconductor device. This corresponds to that etching is performed so as not to remain such a region in a portion which crosses a gate electrode.

Figs. 1A to 1D show a basic structure of the present invention. A plurality of island amorphous semiconductor regions 11 (four regions in the figures) are formed into a rectangle 12 having a long side (a) and a short side (B) as a first shape. In the present invention, it is required that a width of the narrowest portion of the first shape is 100 μm or less. This is because, when the width is 100 μm or more, an effect for characteristic improvement due to contraction of a film at photo-annealing is not obtained. Thus (b) is 100 μm or less in length. (FIG. 1A)

Next, photo-annealing is performed. Thus, the island semiconductor regions are crystallized and contracted at the same time. A dot line of the figure represents a size of the island semiconductor regions before the photo-annealing. New peripheries of the island regions are represented by numeral 14. Regions 13 that distortion is accumulated due to distortion process can be formed in peripheral portions of the island semiconductor regions (Fig. 1B)

Then, the peripheral portions of the island semiconductor regions 11 is etched to form a semiconductor region 15 for the formation of necessary elements (FIG. 1C), and a gate insulating film (not shown) and a gate electrode 16 are formed. (Fig. 1D) When it is not necessary that all the regions 13 that distortion is accumulated is removed, a method as shown in FIGS. 2A to 2D can be used. In this method, an amorphous semiconductor region 21 having a rectangle 22 is formed (FIG. 2A), and then photo-annealed. As a result, as shown in FIGS. 1A to 1D, the semiconductor region 21 is contracted, leaving a region 23 where distortion is accumulated is formed in a peripheral portion. (FIG. 2B)

A region including a peripheral portion of a region that a gate electrode is formed is etched (FIG. 2C), and then a gate insulating film (not shown) and a gate electrode 26 are formed. Since the region 23 where distortion is accumulated is not included in a channel 25 formed under the gate electrode 26, as similar to a case of FIGS. 1A to 1D, deterioration can be decreased (FIG. 2D)

In the present invention, it is preferred that an amorphous semiconductor region at photo-annealing has a possible simple shape with respect to the first shape, for example, a rectangle, a regular polygon and an ellipse including a circle. When, as shown in FIG. 4A, a semiconductor region 41 having a shape 42 that a central portion is concave is photo-annealed, since a concave portion 44 of the central portion is pulled in upper and lower directions (for a source and a drain, for example) at contraction of a film, crack or the like generates easily in this region. (FIGS. 4B and 4C)

This is because, as shown in FIG. 4C (an arrow represents a contraction direction), contraction of a film occurs from a widest portion. Thus, it is desired that the first shape is not a shape having a concave portion, but is a shape having a convex portion in the whole region or a shape not having a concave portion in the whole region.

Therefore, even if the rectangle as shown in FIGS. 1A to 1D is used as the first shape, it is not preferred that a ratio between the long side (a) and the short side (b) is very large. It is preferred that $a/b \leq 10$.

Also, when an island semiconductor region is constructed as a region equivalent to a single-crystalline region or a region substantially equivalent to the single-crystalline region, at crystallization distortion is accumulated in a peripheral portion of the island semiconductor region.

Since this distortion concentrates in the peripheral portion of the island semiconductor region, influence by this distortion can be suppressed by removing a portion around the island semiconductor region.

BRIEF DESCRIPTION OF THE DRAWINGS

Figs. 5A to 5F show producing processes in Embodiment 1;

DETAILED DESCRIPTION OF THE PREFERRED EMBODIMENTS

[Embodiment 1]

Figure 1A:
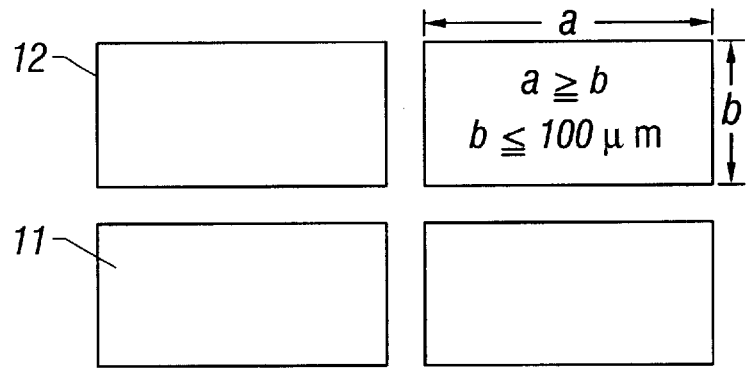
FIGS. 1A to 1D show schematic producing processes (upper views) of the present invention.
Figure 1B:
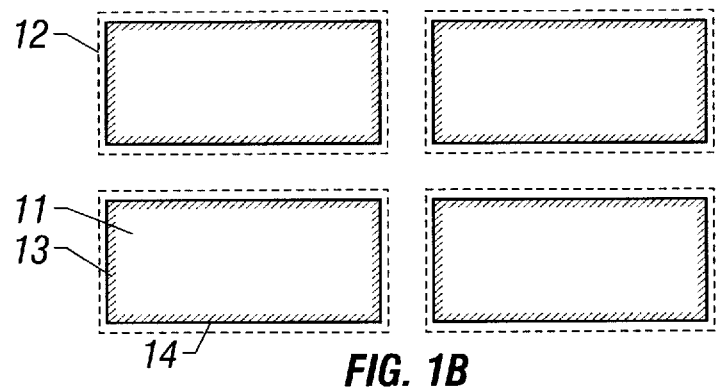
Figure 1C:
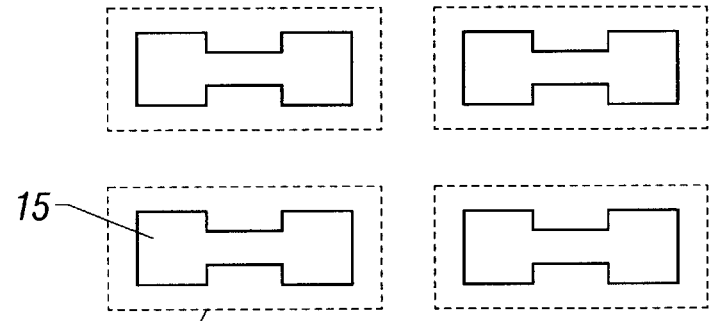
Figure 1D:
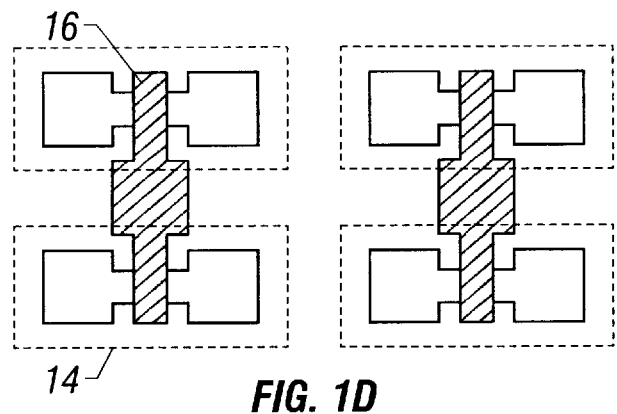
Figure 3A:
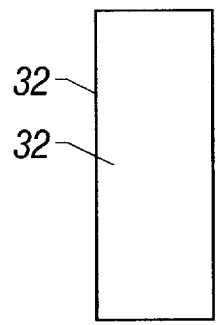
FIGS. 3A to 3D show schematic conventional producing processes (upper and cross section views)
Figure 3B:
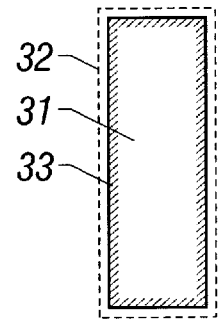
Figure 3C:
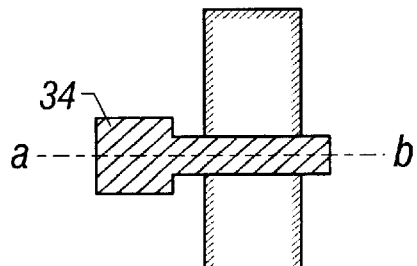
Figure 3D:
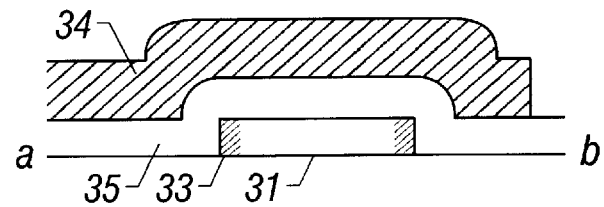
Figure 4A:
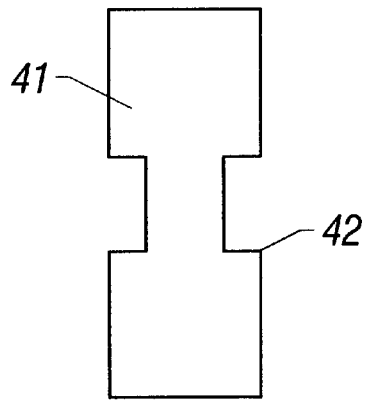
FIGS. 4A to 4c are views explaining a stress applied to a thin film semiconductor at photo-annealing.
Figure 4B:
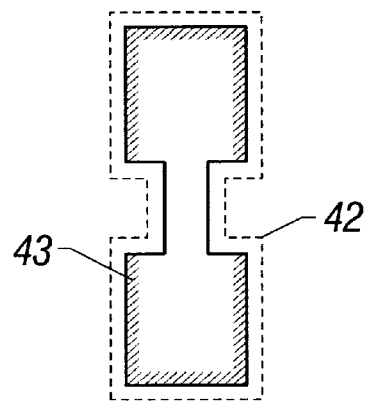
Figure 4C:
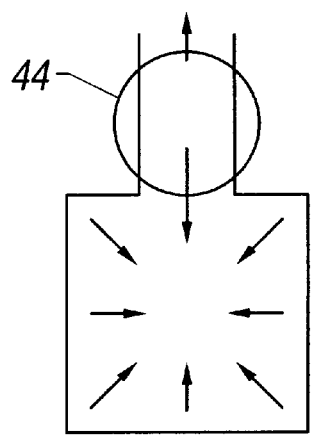

The embodiment is described with FIGS. 5A to 5F. In Figs. 5A to 5F, cross sections of two thin film transistors (TFTS) is shown. The left of each figure, i.e. to the left of the line x—x in FIG. 5A is a cross section obtained by cutting a TFT in vertical to a gate electrode thereof (in vertical to a–b in FIG. 3C). The right side of each figure is a cross section obtained by cutting a TFT in parallel with a gate electrode thereof (along a–b in FIG. 3C). An upper view is referred with Fig. 1D.

A silicon oxide film 502 having a thickness of 3000 Å is formed as a base film on a glass substrate 501 by sputtering or plasma chemical vapor deposition (plasma CVD). Also, By plasma CVD or low pressure thermal CVD, an amorphous silicon film 503 having a thickness of 500 Å is formed. Phosphorus is doped into the amorphous silicon film 503 to form N-type impurity region 504 and 505 which become a source and a drain in a TFT. (FIG. 5A)

The amorphous silicon film 503 is etched to form island silicon regions 506 and 507. (FIG. 5B)

A KrF excimer laser light is irradiated to crystallize a silicon film. At this irradiation the regions 504 and 505 into which the phosphorus is introduced are crystallized and activated at the same time. A energy density of the laser is preferably 150 to 500 mJ/cm$^2$. The laser irradiation process may include two steps or more using laser lights at different energy.

In the embodiment, after a laser light having an energy density of 250 mJ/cm$^2$ is irradiated two to ten pulses, and a laser light having an energy density of 400 mJ/cm$^2$ is irradiated for two to ten pulses. A substrate temperature at the time of laser irradiation is set to 200° C. A suitable energy density of the laser depends on a substrate temperature and a film quality of the amorphous silicon film 503.

As a result, regions 508 where distortion is accumulated are formed in end portions (peripheral portions) of the island silicon regions 506 and 507. (FIG. 5C)

End portions 509 of the island silicon regions 506 and 507 are etched to form new island silicon regions 510 and 511. Portions etched by this process are shown by dotted lines 509. (FIG. 5D)

By plasma CVD, a silicon oxide film 512 (gate insulating film) having a thickness of 1200 Å is formed. Also, an aluminum film (containing 0.3% scandium (Sc)) having a thickness of 5000 Å is deposited on the film 512 by sputtering and then etched to form gate electrodes 513 and 514. (FIG. 5E)

By plasma CVD, a silicon oxide film 515 (interlayer insulator) having a thickness of 5000 Å is deposited, and then contact holes are formed in the film 515. By sputtering, an aluminum film having a thickness of 5000 Å is deposited and etched to form electrode-wirings 516 and 517 for a source and a drain. (FIG. 5F)

By the above processes, a TFT is produced. To obtain a stable characteristic, it is preferred that annealing is performed at one (atmospheric) pressure in an atmosphere containing hydrogen (250 to 350° C.) after a contact hole forming process.

[Embodiment 2]

Figure 2A:
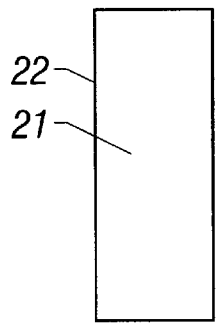
FIGS. 2A to 2D show schematic producing processes (upper views) of the present invention.
Figure 2B:
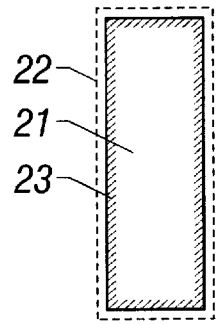
Figure 2C:
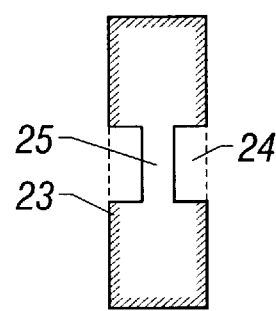
Figure 2D:
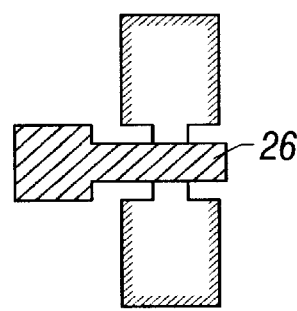

The embodiment is described with FIGS. 6A to 6G. As similar to FIGS. 5A to 5F, In FIGS. 6A to 6G, cross sections of two thin film transistors (TFTs) is shown. The TFT on the left is a cross section obtained by cutting a TFT vertically to a gate electrode thereof. The TFT on the right is a cross section obtained by cutting a TFT in parallel with a gate electrode thereof. An upper view is referred with FIG. 2D.

Figure 6A:
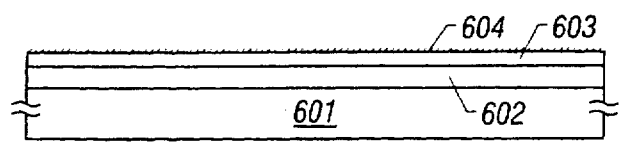
FIGS. 6A to 6G show producing processes in Embodiment 2.

A silicon oxide film 602 having a thickness of 3000 Å is formed as a base film on a glass substrate 601 by sputtering or plasma CVD. Also, By plasma CVD or low pressure thermal CVD, an amorphous silicon film 603 having a thickness of 500 Å is formed. An aqueous solution containing nickel acetate (or cobalt acetate) at 1 to 100 ppm is applied to a surface of the film 603 to form a nickel acetate (cobalt acetate) layer 604. Since the nickel acetate (cobalt acetate) layer 604 is extremely thin, it is not always in a film form. (FIG. 6A)

Figure 6B:
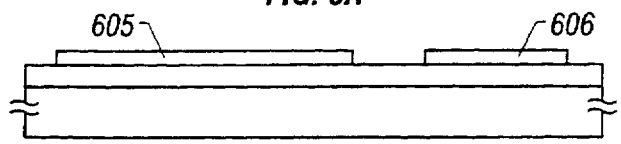

Thermal annealing is performed at 350 to 450° C. for 2 hours in an atmosphere containing nitrogen, to decompose nickel acetate (cobalt acetate) and diffuse nickel (or cobalt) into the amorphous silicon film 603 at the same time. Then, the amorphous silicon film 603 is etched to from island silicon regions 605 and 606. (FIG. 6B)

A KrF excimer laser light is irradiated to crystallize a silicon film by photo-annealing. In the embodiment, after a laser light having an energy density of 200 mJ/cm$^2$ is irradiated two to ten pulses, a laser light having an energy density of 350 mJ/cm$^2$ is irradiated two to ten pulses. A substrate temperature at laser irradiation is set to 200° C.

A suitable energy density of the laser depends on a concentration of the applied nickel (cobalt) in addition to a substrate temperature and a film quality of the amorphous silicon film. In the embodiment, it has confirmed that a concentration of nickel (cobalt) contained in the amorphous silicon film is 1×10$^{18}$ to 5×10$^{18}$ atoms/cm$^3$ from the analysis result by secondary ion mass spectrometry (SIMS).

A method for performing photo-annealing using a catalytic element which promotes crystallization is disclosed in Japanese patent Application Open No. 6-318701.

Figure 6C:
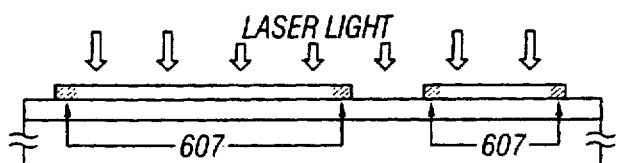

As a result, regions 607 where distortion is accumulated are formed in end portions (peripheral portions) of the island silicon regions 605 and 606. (FIG. 6C)

Figure 6D:
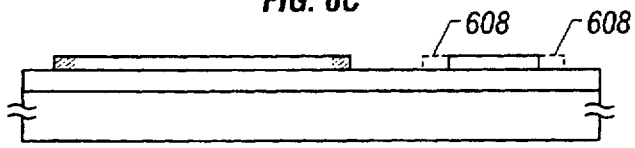

In end portions 607 of the island silicon regions 605 and 606, only portions which cross a gate electrode are etched to form new island silicon regions. The portions etched by this process are shown by dotted lines 608. (FIG. 6D)

Figure 6E:
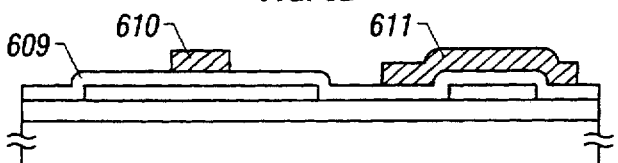

By plasma CVD, a silicon oxide film 609 (gate insulating film) having a thickness of 1200 Å is formed. Also, a poly-crystalline silicon film (containing 1% phosphorus) having a thickness of 5000 Å is deposited on the film 609 by low pressure CVD and then etched to form gate electrodes 610 and 611. (FIG. 6E)

By ion doping, an phosphorus ion is introduced into a silicon film using the gate electrode as a mask. A doping gas is phosphine (PH$_3$) diluted with hydrogen at 5%. An accelerating voltage is preferably 60 to 110 kV. A dose is 1×10$^{14}$ to 5×10$^{15}$ atoms/cm$^2$. Thus, N-type impurity regions (source and drain) 612 and 613 are formed.

After the doping, thermal annealing is performed at 450° C. for 4 hours, Thus, the impurity can be activated. This is because nickel (cobalt) is contained in a semiconductor region. (See Japanese Patent Application Open No. 6-267989)

After the thermal annealing process for activation, photo-annealing may be performed by irradiating a laser light or the like.

Figure 6F:
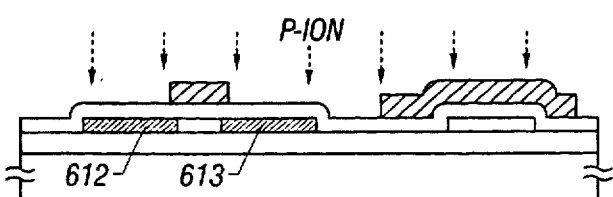

After the above process, annealing is performed at one atmosphere of pressure in an atmosphere containing hydrogen (250 to 350° C.), to neutralize dangling bonds in an interface between a gate insulating film and a semiconductor region. (FIG. 6F)

Figure 6G:
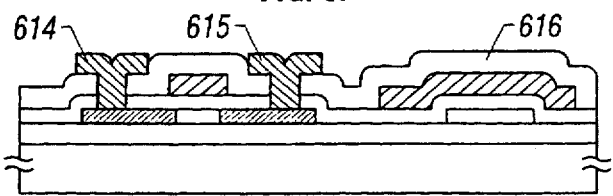

By plasma CVD, a silicon oxide film 616 (interlayer insulator having a thickness of 5000 Å is deposited, and then contact holes are formed in the film 616. By sputtering, an aluminum film having a thickness of 5000 Å is deposited and etched to form electrode-wirings 614 and 615 for a source and a drain. (FIG. 6G)

[Embodiment 3]

In the embodiment, a metal element which promotes crystallization of silicon is introduced into an amorphous silicon film and then a laser light is irradiated to form a region substantially equivalent to a single-crystalline region, so that an active layer of a TFT is constructed using the region substantially equivalent to the single-crystalline region.

FIGS. 7A to 7E show a part of producing processes of a TFT according to the embodiment. A silicon oxide film 702 having a thickness of 3000 Å is formed as a base film on a glass substrate 701 by plasma CVD or sputtering. Also, an amorphous silicon film 703 having a thickness of 500 Å is formed by plasma CVD or low pressure thermal CVD.

Figure 7A:
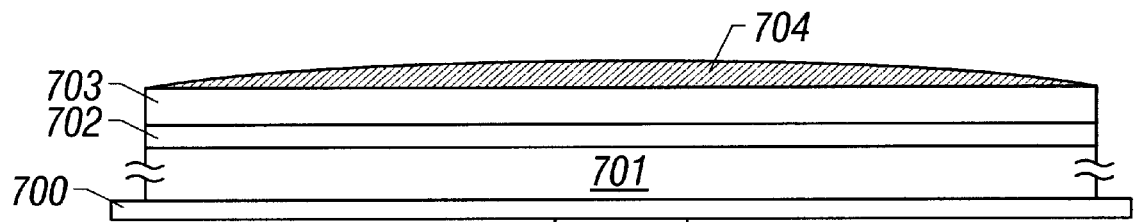
FIGS. 7A to 7E and 8A to 8C show producing processes in Embodiment 3.

A sample formed on the substrate is placed on a spinner 700. In this state, a nickel acetate solution having an adjusted nickel concentration is applied to the sample to form an aqueous (water) film 704. This state is shown in FIG. 7A. By spin dry using the spinner 700, an unnecessary nickel acetate solution is removed (blown away). Thus, a state that a small amount of nickel is held in contact with the surface of the amorphous silicon film is obtained.

Figure 7B:
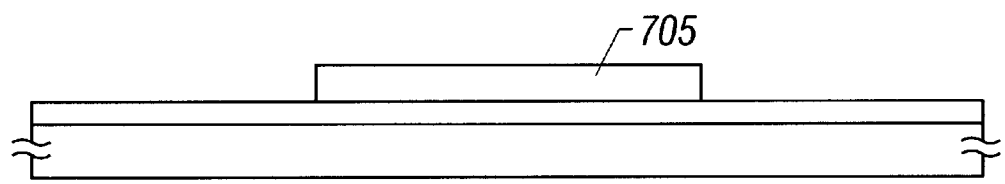

By patterning, an active layer 705 of a TFT is formed. At this state, the active layer 705 is constructed by the amorphous silicon film 703. (FIG. 7B)

In this state, a laser light is irradiated to crystallize the active layer 705 made of the amorphous silicon film 703. The used laser light is processed into a linear beam. The laser light is irradiated from one side of the active layer 705 to an opposite side thereof while scanning the linear laser light. It is necessary to use a pulse-oscillated excimer laser as a laser light. In the embodiment, a KrF excimer laser (wavelength of 248 nm) is used.

The laser light is irradiated while a substrate is heated at 500° C. This is because of the relaxation of large change of a crystal structure due to laser light irradiation. It is preferred that the heating temperature is 450° C. to a temperature equal to and lower than the distortion point of a glass substrate.

When the linear laser light is irradiated into the amorphous silicon film, a region into which the laser light is irradiated is melted instantaneously. By irradiating the linear laser light while scanning it, crystal growth progresses gradually. Thus, the region equivalent to the single-crystalline region can be obtained.

Figure 7C:
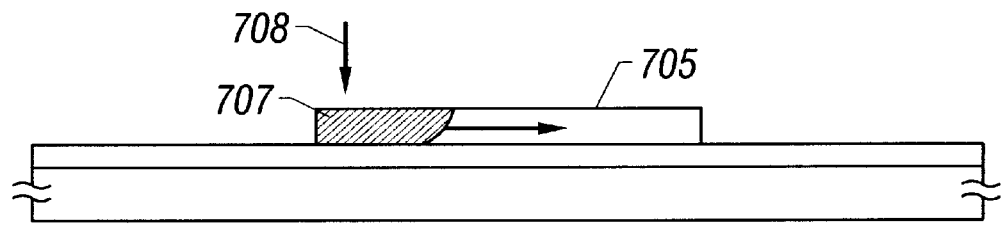

That is, as shown in FIG. 7C, in a case wherein a linear laser light 708 is irradiated gradually from one end portion of the active layer 705 constructed by the amorphous silicon film 703 to the other portion thereof while scanning it, a region 707 equivalent to the single-crystalline region is crystal-grown in accordance with the laser light irradiation, the whole active layer 705 can be obtained at a single-crystalline equivalent state.

Figure 7D:
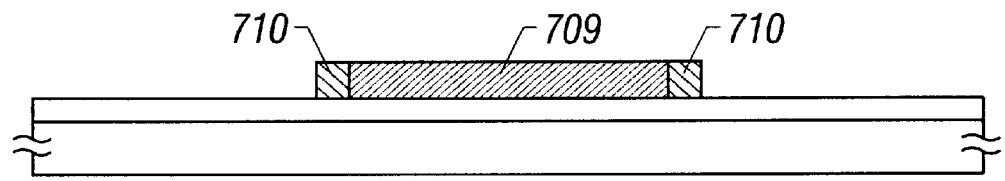

Thus, an active layer 709 constructed by a silicon thin film equivalent to a single-crystalline thin film is obtained. (FIG. 7D)

The region equivalent to the single-crystalline region is required to satisfy the following conditions.

(1) The region does not contain substantially crystal boundary.

(2) The region contains hydrogen or a halogen element to neutralize a point defect at a concentration of $1 \times 10^{15}$ to $1 \times 10^{20}$ atoms cm$^{-3}$.

(3) The region contains carbon or nitrogen at a concentration of $1 \times 10^{16}$ to $5 \times 10^{18}$ atoms cm$^{-3}$.

(4) The region contains oxygen at a concentration of $1 \times 10^{17}$ to $5 \times 10^{19}$ atoms cm$^{-3}$.

In a case wherein the metal element which promotes crystallization of silicon, as described in the embodiments is used, it is necessary to contain the metal element at a concentration of $1 \times 10^{16}$ to $5 \times 10^{19}$ cm$^{-3}$ in a film. If the metal element is contained at a concentration larger than the concentration range, a semiconductor characteristic is not obtained but a metallic characteristic is obtained. Also, if the metal element is contained at a concentration lower than the concentration range, an action for promoting crystallization of silicon cannot be obtained.

From the above description, the silicon film region which is obtained by the laser light irradiation and is equivalent to the single-crystalline region is essentially different from a commonly called single-crystal such as a single-crystalline wafer.

At crystallization by the laser light irradiation, contraction of a film occurs, and the distortion is accumulated largely toward peripheral portions of the active layer 709. That is, the distortion is concentrated in a portion 710 as shown in FIG. 7D and accumulated.

In general, a thickness of the active layer is about several hundreds Å to several thousands Å. A size thereof is several $\mu$m square to several hundreds $\mu$m square. That is, it is extremely thin and has a thin film form. In such a thin film form state, if crystal growth as shown in FIG. 7C progresses, the distortion is concentrated in a peripheral portion, i.e., a portion around a region that crystal growth is completed or a region that crystal growth does not progress any more.

From the above two causes, the distortion is concentrated around the active layer. It is not preferred that a region in which such distortion is concentrated is present in the active layer 709 since the region may influence the operation of a TFT.

Figure 7E:
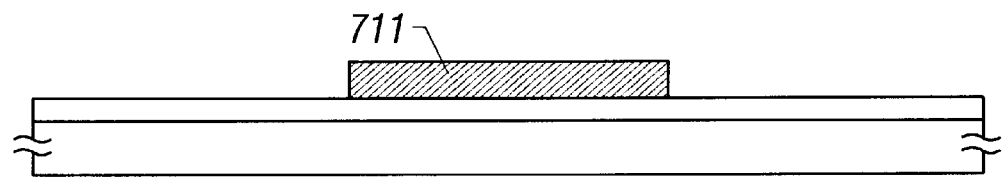

Thus, in the embodiment, the whole peripheral portion of the active layer 709 is etched, As a result, an active layer 711 which is constructed by the region substantially equivalent to the single-crystalline region and in which influence due to stress is reduced can be obtained. (FIG. 7E)

Figure 8A:
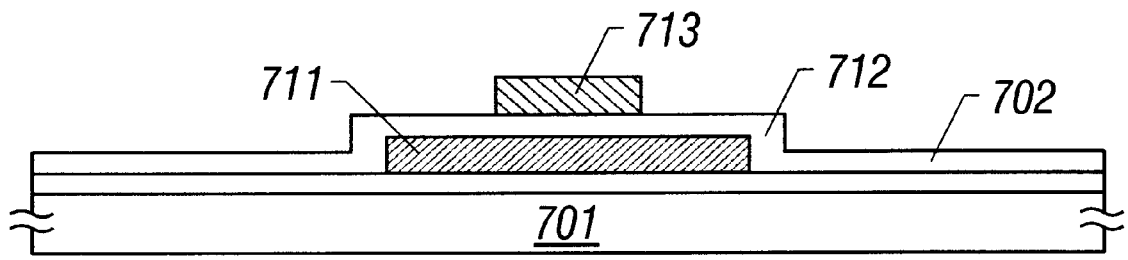

After the active layer 711 is obtained, as shown in FIG. 8A, a silicon oxide film having a thickness of 1000 Å is formed as a gate insulating film 712 by plasma CVD, to cover the active layer 111. A poly-crystalline silicon film into which a large amount of phosphorus (P) is doped is formed at a thickness of 5000 Å by low pressure thermal CVD and then patterned to from a gate electrode 713. (FIG. 8A)

Figure 8B:
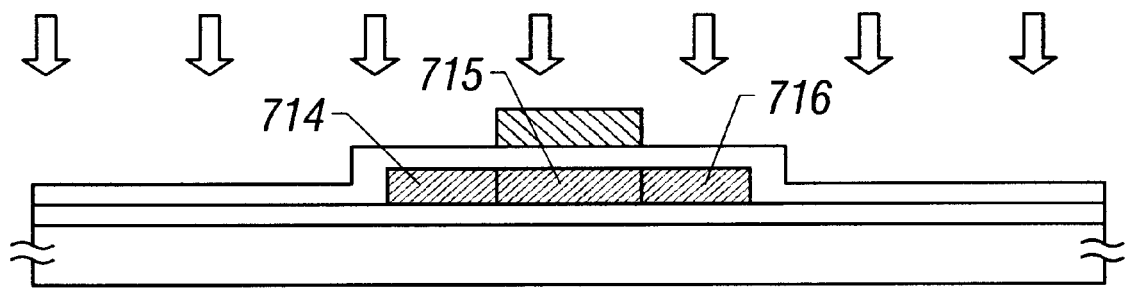

An phosphorus (P) ion is implanted by plasma doping or ion implantation, to form a source region 714 and a drain region 716 in a self-alignment. Also, by using the gate electrode 713 as a mask, a region 715 into which an impurity ion (phosphorus) is not implanted is determined as a channel forming region. (FIG. 8B)

Figure 8C:
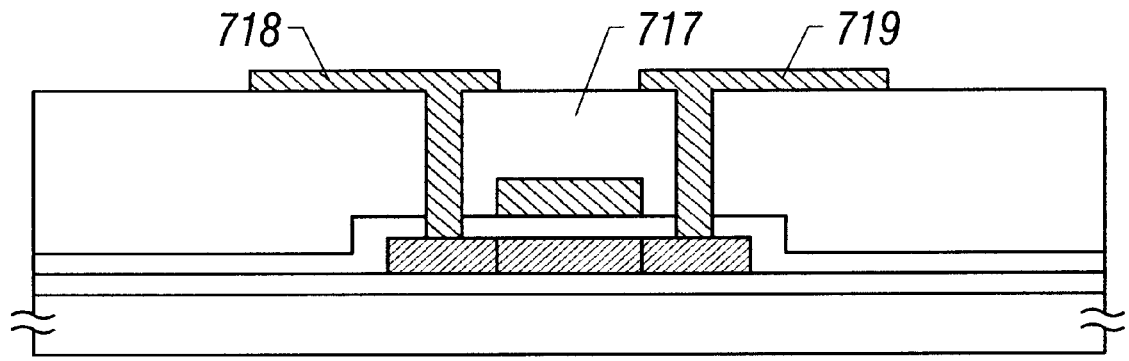

A silicon oxide film 717 having a thickness of 7000 Å is formed as an interlayer insulating film by plasma CVD using a tetraethoxysilane (TEOS) gas. After forming contact holes, source and drain electrodes 718 and 719 are formed using a multilayer film of titanium and aluminum. Although not shown in figures, a contact electrode for the gate electrode 713 is formed at the same time. Then, heating treatment is performed at 350° C. for 1 hour in an atmosphere containing hydrogen, to complete a TFT as shown in FIG. 8C.

Since the obtained TFT is constructed by a silicon film of which the active layer is equivalent to single-crystal, an electrical characteristic of the obtained TFT can be almost equal to that of a TFT which is produced using an SOI technique or the like and constructed using a single-crystalline silicon film.

[Embodiment 4]

In the embodiment, a manner for irradiating a laser light into an amorphous silicon film patterned to construct an active layer is modified in the structure of Embodiment 3, in order to crystallize it easily.

Figure 9:
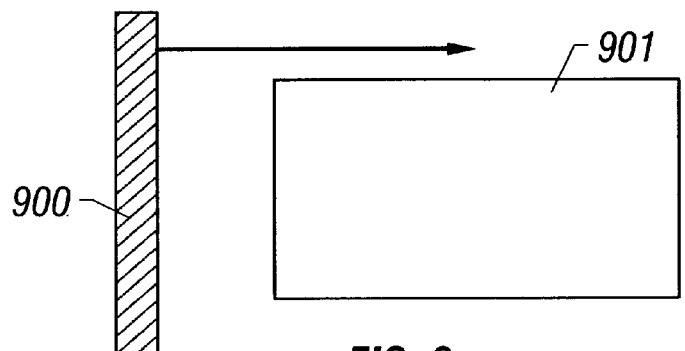
FIGS. 9 and 10 are upper views representing a state that a linear laser light is irradiated into an active layer (island semiconductor region.

FIG. 9 shows a method for irradiating a laser light into an active layer in the processes according to Embodiment 3. In this method, a linear laser light having a longitudinal direction is irradiated in parallel with one side of a patterned amorphous silicon film 901 (since this film becomes an active layer later, it is called the active layer). By scanning along a direction of an arrow while irradiating the laser light, the active layer 901 is converted into the region equivalent to a single-crystalline region.

Figure 10:
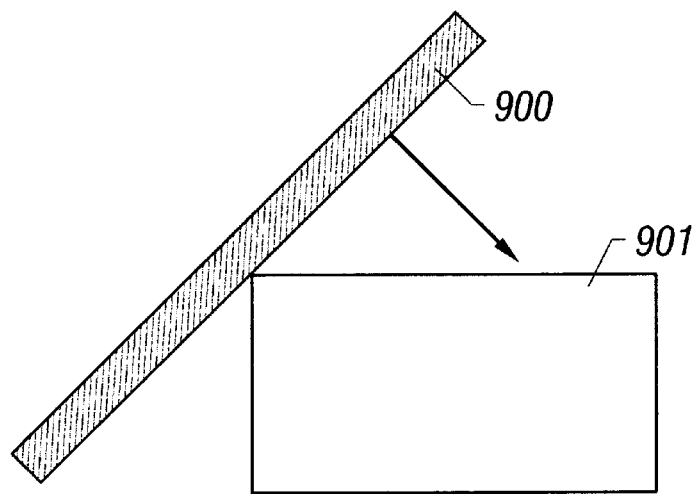
Figure 11:
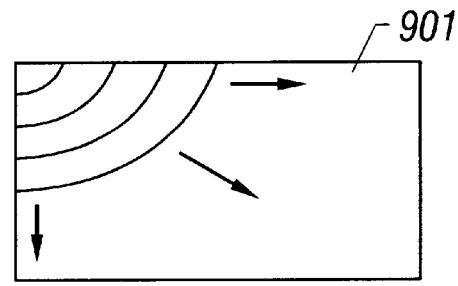
FIG. 11 is an upper view representing a crystallization state when a linear laser light is irradiated into an active layer (island semiconductor region).

In the method according to the embodiment, a scan direction of the linear laser light 900 can be set so as to progress crystal growth from a corner portion of the active layer 901, as shown in FIG. 10. When the laser light irradiation method of FIG. 10 is used, since crystal growth progresses gradually from a narrow region toward a wide region, as shown in FIG. 11, the progress of crystal growth is performed easily. In comparison with a case wherein the laser light is irradiated in the state as shown in FIG. 9, the region equivalent to the single-crystalline region can be formed and high repeatability can be obtained.

According to the present invention, deterioration of an insulated gate type semiconductor device produced using a semiconductor device crystallized by photo-annealing can be decreased. Although, in the embodiments, a silicon semiconductor is mainly described, the same effect is also obtained in another semiconductor such as a silicon-germanium alloy semiconductor, a zinc sulfide semiconductor and a silicon carbide semiconductor. Thus, the present invention has an industrial value.

What is claimed is:

1. A method of manufacturing a semiconductor device including at least one thin film transistor, said method comprising:

forming a semiconductor film comprising silicon over a substrate;

irradiating said semiconductor film with a linear laser beam having a line shaped cross section at said semiconductor film, thereby crystallizing said semiconductor film; and forming source, drain and channel regions of said thin film transistor within said semiconductor film, wherein the irradiation of said semiconductor film is conducted in such a manner that said semiconductor film is scanned with said linear laser beam in an oblique direction with respect to a carrier flow direction in said channel region.

2. The method of claim 1 wherein said semiconductor film comprises amorphous silicon.

3. A method of manufacturing a semiconductor device including at least one thin film transistor, said method comprising:

forming a semiconductor film comprising silicon over a substrate;

irradiating said semiconductor film with a linear laser beam having a line shaped cross section at said semiconductor film, thereby crystallizing said semiconductor film; and selectively etching said semiconductor film after the irradiation to form an active region of said thin film transistor, wherein the irradiation of said semiconductor film is conducted in such a manner that said semiconductor film is scanned with said linear laser beam in an oblique direction with respect to a carrier flow direction in said active region.

4. The method of claim 3 wherein said semiconductor film comprises amorphous silicon.

5. A method for producing a semiconductor device comprising:

etching an amorphous semiconductor film to form an island semiconductor region; and irradiating light to the island semiconductor region with the light being scanned relative to the island semiconductor region in a direction oblique to a side of the island semiconductor region.

6. The method of claim 5 wherein the semiconductor film comprises a silicon-germanium alloy semiconductor.

* * * * *

UNITED STATES PATENT AND TRADEMARK OFFICE
CERTIFICATE OF CORRECTION

PATENT NO. : 5,953,597
DATED : September 14, 1999
INVENTOR(S) : Naoto Kusumoto and Shunpei Yamazaki It is certified that error appears in the above-identified patent and that said Letters Patent is hereby corrected as shown below:

Column 2,
Line 2, after "accumulated", insert a comma -- , --.

Column 3,
Line 45, after "(Fig. 1B)", insert a period -- . --; and
Line 65, after "(FIG. 2D)", insert a period -- . --.

Column 4,
Line 18, correct "$a/b \leq 10$" to read --$a/b \geq 10$--;
Line 38, change "4c" to read -- 4C --;
Line 58, change "(TFTS)" to -- (TFTs) --; and
Line 59, after "5A", insert a comma -- , --.

Column 6,
Line 1, delete "from" and substitute -- form --;
Line 18, change "patent" to -- Patent --;
Line 32, delete "an" and substitute -- a --; and
Line 39, after "hours" delete the comma (,) and insert a period -- . --.

Column 8,
Line 22, after "etched", delete a comma (,) and insert a period -- . --; and
Line 32, delete "from" and substitute -- form --.

Drawings,
Please add the attached Figures 6A-6G, which were part of the prosecuted application, but erroneously left out of the patent as printed.

Signed and Sealed this

Twelfth Day of February, 2002

Attest:

JAMES E. ROGAN
Attesting Officer       Director of the United States Patent and Trademark Office